(12) United States Patent
Chen

(10) Patent No.: US 7,286,412 B1
(45) Date of Patent: Oct. 23, 2007

(54) METHOD AND APPARATUS TO IMPROVE NONVOLATILE MEMORY DATA RETENTION

(75) Inventor: Chung Kuang Chen, Pan Chiao (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 11/382,350

(22) Filed: May 9, 2006

(51) Int. Cl.
 *G11C 16/04* (2006.01)
(52) U.S. Cl. .................. 365/185.24; 365/207; 365/210; 365/189.07
(58) Field of Classification Search ............ 365/185.24
 See application file for complete search history.

(56) References Cited

U.S. PATENT DOCUMENTS 6,229,734 B1 * 5/2001 Watanabe ............... 365/185.22
6,636,440 B2 10/2003 Maayan et al.

* cited by examiner

*Primary Examiner*—Thong Q. Le
(74) *Attorney, Agent, or Firm*—Kenta Suzue; Haynes Beffel & Wolfeld LLP

(57) ABSTRACT

Disclosed are apparatuses, methods, and manufacturing methods relating to improving data retention in nonvolatile memory. In many embodiments, monitor reference currents in addition to a normal reference current are used to determine whether to refresh the data memory.

26 Claims, 18 Drawing Sheets

METHOD AND APPARATUS TO IMPROVE NONVOLATILE MEMORY DATA RETENTION

BACKGROUND OF THE INVENTION

1. Field

The field of the technology relates to nonvolatile memory. More specifically, the technology relates to data retention in nonvolatile memory cells despite charge leakage and other factors that cause errors in data storage such as read disturbs and margin loss.

2. Description of Related Art

Storage density in nonvolatile memory cells is increased by utilizing a multi-level threshold voltage algorithm, which typically encodes at least two bits per nonvolatile memory cell. In the case of charge trapping memory cells, nanocrystal memory cells, and other memory cells with localized charge structures, each localized charge portion encodes at least two bits per cell in a multi-level threshold voltage algorithm.

However, such multi-level threshold voltage algorithms require many distinct threshold voltage states. For example, a 2-bit scheme requires four threshold voltage states, a 3-bit scheme requires eight threshold voltage states, an so on. To squeeze this many threshold voltage states within the permitted range of threshold voltages of the nonvolatile memory cell, the margin between neighboring threshold voltage states may be narrowed as a result of bunching distinct threshold voltage states closer together. However, such a threshold voltage algorithm is more vulnerable to data errors due to charge leakage, margin loss, and disturbs.

FIG. 1 shows an example threshold voltage design algorithm for a nonvolatile memory cell. FIG. 1 shows: the 0.8 V initial distribution of a low threshold voltage state 110, the 0.4 V cycling margin 120, the room temperature and read disturb 0.15 V 130, the 0.7 V final threshold voltage window 140, the 0.7 V charge loss margin 150, and the 0.7 V distribution of a high threshold voltage state 160. The table below shows the threshold voltages corresponding to different points along the voltage axis.

|     | Margin Mode 15 μA | Target Device 1 μA Vth |
| --- | --- | --- |
| 111 | 3.05 V | 1.90 V |
| 115 | 3.45 V | 2.3 V |
| 125 | 3.85 V | 2.7 V |
| 135 | 4.0 V | 2.85 V |
| 145 | 4.7 V | 3.55 V |
| 155 | 5.4 V | 4.25 V |
| 165 | 6.1 V | 4.95 V |

Therefore, it would be desirable to bunch together distinct threshold voltage states more closely together, without increasing the risk of data storage errors from confusing neighboring threshold voltage states.

SUMMARY OF THE INVENTION

One aspect of the technology is a nonvolatile memory integrated circuit, comprising nonvolatile memory cells, reference current circuitry, sense amplifier circuitry, and comparison logic The nonvolatile memory cells include data cells storing least data values associated with a low threshold voltage and a high threshold voltage. In some embodiments, the data cells have a charge loss margin of less than 0.7 V, a charge loss margin of about 0.2 V, a cycling margin of less than 0.4 V, and are multi-level cells with more than two logical levels.

The reference current circuitry generates reference currents. Each reference current has a high sensing window to sense the high threshold voltage and a low sensing window to sense the low threshold voltage. The reference currents are 1) a normal reference current associated with a first operating window having a first high sensing window and a first low sensing window, 2) a first monitor reference current associated with a second operating window having a second high sensing window narrower than the first high sensing window and a second low sensing window wider than the first low sensing window; and 3) a second monitor reference current associated with a third operating window having a third high sensing window wider than the first high sensing window and a third low sensing window narrower than the first low sensing window.

In some embodiments, at least one of the first and second monitor reference currents is higher than the normal reference current and a low bound representing high threshold voltage cells. In other embodiments, at least one of the first and second monitor reference currents is lower than the normal reference current and a high bound representing low threshold voltage cells.

The sense amplifier circuitry senses the memory current from the data cells with the normal reference current to generate a first result. The sense amplifier circuitry also senses the memory current with at least one of: the first monitor reference current to generate a second result, and the second monitor reference current to generate a third result.

Some embodiments have a single set of sense amplifiers sensing the memory current from the data cells, in series, with the normal reference current and at least one of the first and second monitor reference currents. Other embodiments include different sets of sense amplifiers dedicated to sensing the memory current from the data cells with the normal reference current, and with at least one of the first and second monitor reference currents. Yet other embodiments include different sets of sense amplifiers dedicated to sensing the memory current from the data cells with the normal reference current, with the first monitor reference current, and with the second monitor reference current.

The comparison logic compares the first result with at least one of the second result and the third result from the sense amplifier circuitry. In various embodiments, a failure for results to match, returned by the comparison logic, is caused by the memory current falling outside the second operating margin, or charge loss from a nonvolatile memory cell.

Some embodiments include an externally accessible contact of the integrated circuit having an output state indicating that the integrated circuit is busy. Other embodiments include a first externally accessible contact of the integrated circuit indicating whether the integrated circuit is busy determining a need to refresh, and a second externally accessible contact of the integrated circuit indicating whether the integrated circuit is ready for a new command or refreshing.

In some embodiments, the first result controls which of the second result and the third result to compare with the first result, to determine whether to refresh said at least one data cell. For example, the normal reference current controls a data mux to select the second result or the third result. In other embodiments, if the first result with the normal reference current is the high threshold voltage, then the first result is compared with the second result, and if the first result with the normal reference current is the low threshold voltage, then the first result is compared with the third result. IN yet another embodiment, only one of the first monitor reference current and the second monitor reference current is used in a memory operation.

Some embodiments further comprise control circuitry responding to a memory user mode command by applying bias arrangements to the data cells. Receipt by the control circuitry of memory user mode commands causes the control circuitry to apply bias arrangements to a data cell to generate the memory current. The control circuitry refreshes the data cell in response to a failure of the first result to agree with at least one of the second result and the third result.

Another aspect of the technology is directed to a method of operating nonvolatile memory, comprising, responsive to a memory user mode command, performing:

The step of applying a bias arrangement to a nonvolatile data cell to generate a memory current representing data values stored in said the nonvolatile data cell, the data values associated with a low threshold voltage and a high threshold voltage.

The step of generating reference currents each with a high sensing window to sense the high threshold voltage and a low sensing window to sense the low threshold voltage, including:

The substep of generating a normal reference current associated with a first operating window having a first high sensing window and a first low sensing window;

The substep of generating a first monitor reference current associated with a second operating window having a second high sensing window narrower than the first high sensing window, and a second low sensing window wider than the first low sensing window; and The substep of generating a second monitor reference current associated with a third operating window having a third high sensing window wider than the first high sensing window and a third low sensing window narrower than the first low sensing window;

The step of sensing the memory current with the normal reference current to generate a first result, and further performing at least one of:

The substep of sensing the memory current with the first monitor reference current to generate a second result; and The substep of sensing the memory current with the second monitor reference current to generate a third result; and The step of comparing the first result with at least one of the second result and the third result.

In some embodiments, sensing with the normal reference current occurs in parallel with at least one of: sensing with the first monitor reference current, and sensing with the second monitor reference current. In other embodiments, sensing with the normal reference current occurs in series with at least one of: sensing with the first monitor reference current and sensing with the second monitor reference current. In some embodiments, only one of sensing with the first monitor reference current and sensing with the second monitor reference current is performed, in at least one memory operation.

In some embodiments, the first result controls which of sensing with the first monitor reference current and sensing with the second monitor reference current is performed, to determine whether to refresh said at least one data cell.

In some embodiments, sensing with the first monitor reference current is performed, if the first result with the normal reference current is the high threshold voltage, and sensing with the second monitor reference current is performed, if the first result with the normal reference current is the low threshold voltage.

Some embodiments further include:

The step of refreshing at least one data cell in response to a failure of the first result to agree with at least one of the second result and the third result.

DETAILED DESCRIPTION

Figure 1:
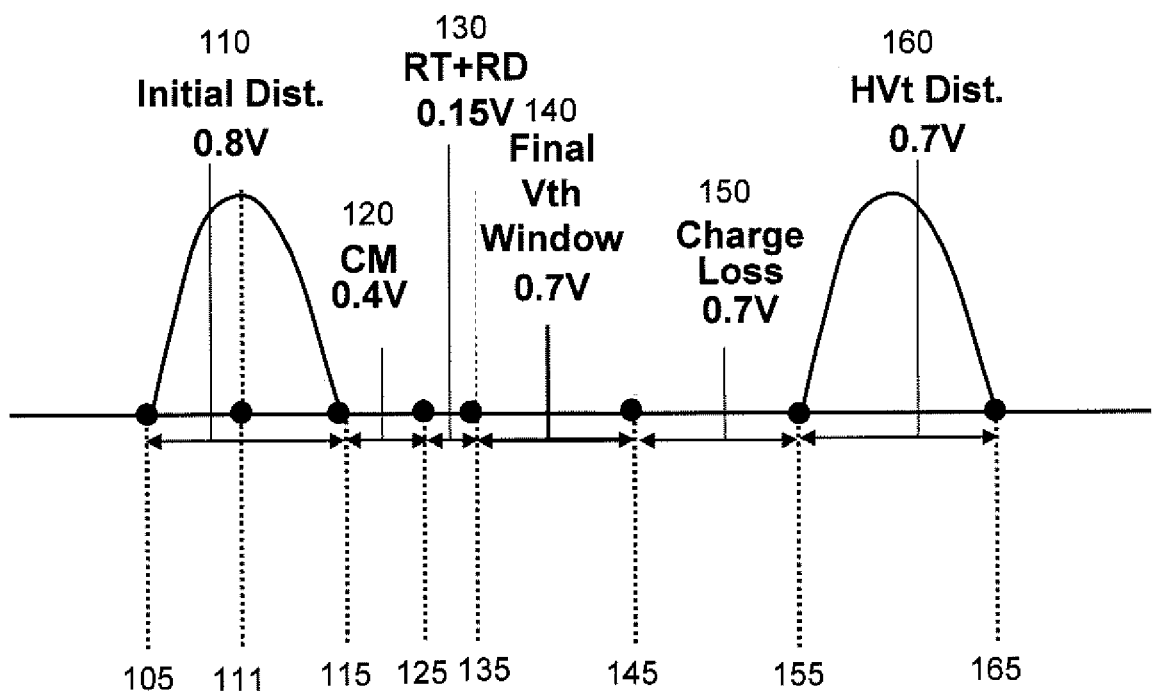
FIG. 1 shows a threshold voltage design distribution for a nonvolatile memory cell, where CM is cycling margin, RT is room temperature drift, and RD is read disturb.

FIG. 1 shows a plot of a nonvolatile memory cell threshold voltage distribution. 105 is initial threshold voltage low bound. 110 is the initial distribution window. 111 is the middle value of the initial threshold voltage. 115 is the initial threshold voltage high bound. 120 is the low threshold voltage cycling margin. 130 is the threshold voltage room temperature drift and read disturb. 140 is the circuit read window and array cell final threshold voltage window. 150 is the charge loss window. 155 is the high threshold voltage distribution low bound. 160 is the threshold voltage of the programmed cells. 165 is the high threshold voltage distribution high bound.

Figure 2:
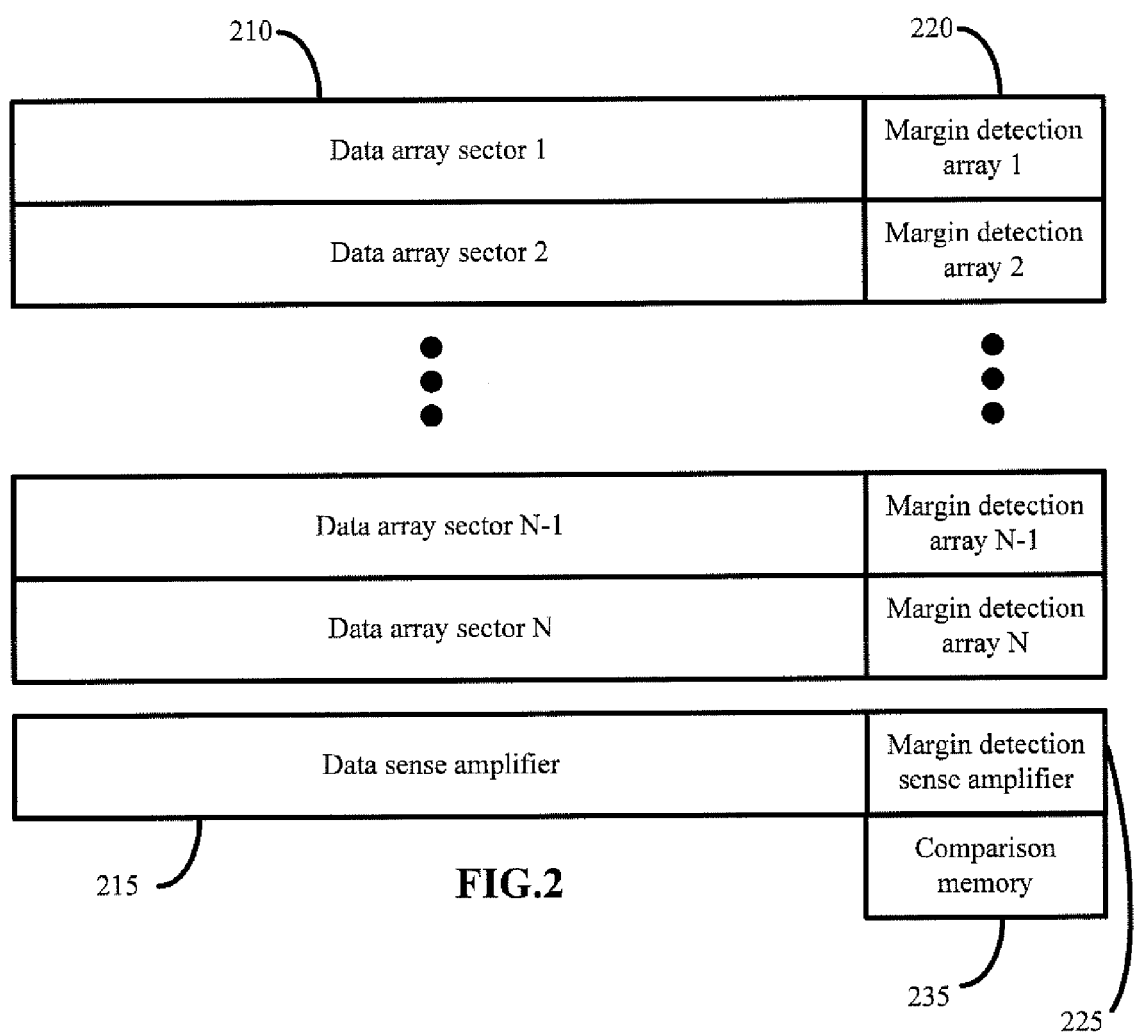
FIG. 2 shows a schematic of nonvolatile memory cells separated into a data memory portion and a margin detection memory portion, whose contents are determined respectively by a data sense amplifier portion and a margin detection sense amplifier portion; the margin detection data from the margin detection memory is compared with the default data in a comparison memory.

FIG. 2 shows a schematic of nonvolatile memory cells separated into a data memory portion and a margin detection memory portion, whose contents are determined respectively by a data sense amplifier portion and a margin detection sense amplifier portion. The data memory portion of nonvolatile memory cells includes data sectors 1 to N 210. The contents of this data portion of nonvolatile memory cells is read by the data sense amplifier portion 215. The margin detection memory portion of nonvolatile memory cells 220 includes multiple parts that each correspond to different data memory sectors 1 to N 210. In this way, each data memory sector has at least one corresponding margin detection memory cell. Each sector of data memory includes multiple rows of memory cells separately accessible by word lines. In one embodiment, each word line of memory cells has at least one corresponding margin detection memory cell. The contents of the margin detection memory portion of nonvolatile memory cells is read by the margin detection sense amplifier portion 225. Thus, the contents of a particular part of the data memory portion 210 can be read in parallel with the contents of the corresponding part of the margin detection memory portion 220. Then the sensed contents of the margin detection memory portion 220 are compared with the default contents of the comparison block 235. If the comparison fails, then the corresponding data cell block needs to be refreshed. The margin detection array data can be compared with the default values by storing at least one of these values from the margin detection array in the comparison block 235 which includes comparison memory and comparison circuitry.

Figure 3:
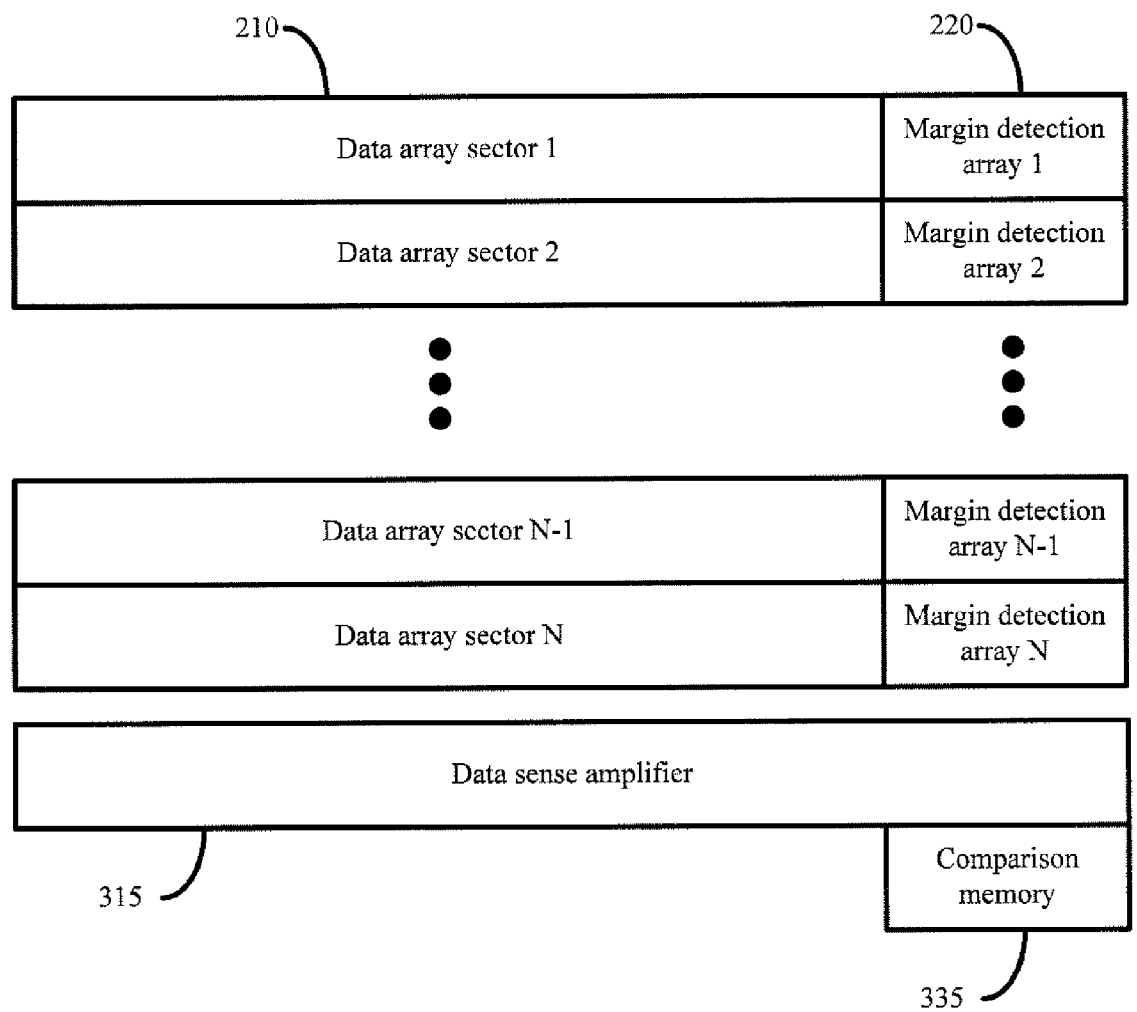
FIG. 3 shows a schematic of nonvolatile memory cells separated into a data memory portion and a margin detection memory portion, whose contents are determined by a sense amplifier portion; the margin detection data from the margin detection memory is compared with default data in a comparison memory.

FIG. 3 shows a schematic of memory cells separated into a data memory portion and a margin detection memory portion, whose contents are determined by a sense amplifier portion. Then the sensed contents of the margin detection memory portion are compared with the default contents of the comparison memory 335. FIG. 3 resembles the memory cell schematic of FIG. 2. However, the sense amplifier portion 315 is used by both the data memory portion of nonvolatile memory cells including data sectors 1 to N 210 and the margin detection memory portion of nonvolatile memory cells 220 including multiple parts that each correspond to different data memory sectors 1 to N 210. Thus, the contents of a particular part of the data memory portion 210 can be read in series with the contents of the corresponding part of the margin detection memory portion 220. The data sensed from the margin detection array can be compared with the default values in the comparison block 235.

Figure 4:
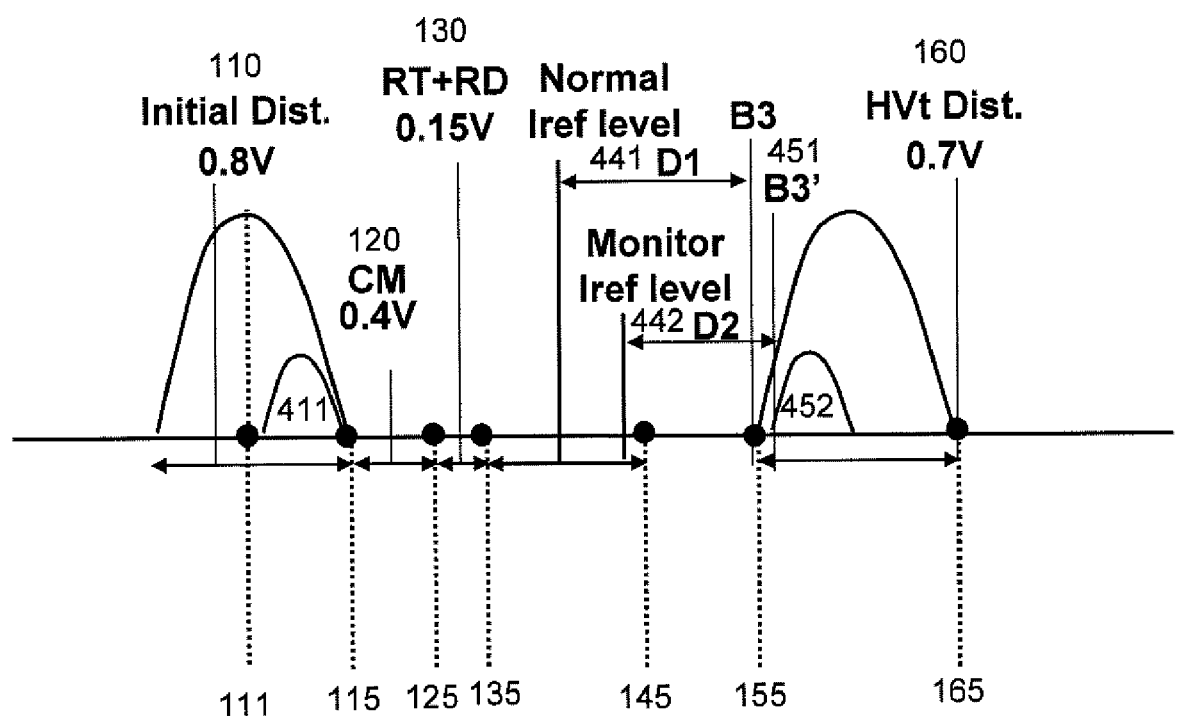
FIG. 4 shows a threshold voltage design algorithm for a nonvolatile memory cell with narrower charge loss margin by using both the normal Iref and the monitor Iref.

FIG. 4 shows a threshold voltage design algorithm for a nonvolatile memory cell with narrower charge loss margin than the threshold voltage design algorithm of FIG. 1. 155 is the low bound of the threshold voltage distribution of the data array. 411 is the margin detection cell initial distribution. 441 is the data cells cycling margin, D1. 442 is the margin detection cells cycling margin, D2. 451 is the low bound of the threshold voltage distribution. 452 is the high threshold voltage distribution of the margin detection array. The narrower threshold voltage distributions 411 and 452 correspond to the low threshold voltage state and high threshold voltage state, respectively, of the margin detection cells. The data cell high threshold voltage state corresponds to a normal reference current level and a wider charge loss margin 441. The low bound of margin detection cell high threshold voltage state 452 corresponds to a monitor current reference level 442. Because the margin detection high threshold voltage state 452 has a narrower window than the normal current reference level 441, a failure to retain charge in the corresponding margin detection cell is detected sooner than in the data cell. The narrower margin corresponding to the margin detection cell therefore controls the refresh time of the data memory cell. The table below shows the threshold voltages corresponding to different points along the voltage axis. According to this algorithm, a data cell doesn't need to keep a large charge loss margin for a long time. With the algorithm, the data cell can keep a smaller cycling margin and improve the nonvolatile memory cell operating window. Monitor_Iref_2 level can be tuned to monitor the C.M. & R.T.+R.D. window, to narrow this window, and improve the operating window. The refresh action includes program and erase functions that are dependent on if the programmed cell undergoes charge loss and the erased cell undergoes charge gain.

|     | Margin Mode 15 μA | Target Device 1 μA Vth |
| --- | --- | --- |
| 111 | 3.05 V | 1.90 V |
| 115 | 3.45 V | 2.3 V |
| 125 | 3.85 V | 2.7 V |
| 135 | 4.0 V | 2.85 V |
| 145 | 4.7 V | 3.55 V |
| 155 | 4.9 V | 3.75 V |
| 165 | 5.6 V | 4.45 V |

Figure 5:
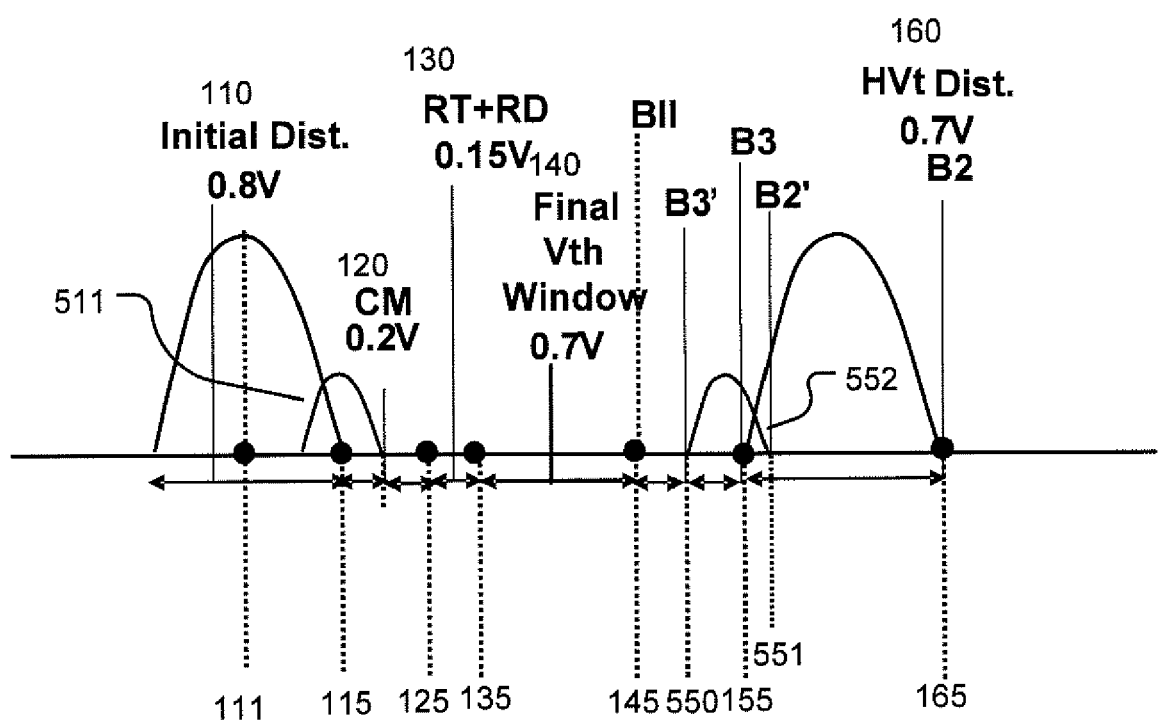
FIG. 5 shows another threshold voltage design algorithm for a nonvolatile memory cell with narrower charge loss margin which controls the boundary of the high threshold voltage distribution and the boundary of the low threshold voltage distribution of the margin detection array.

FIG. 5 shows another threshold voltage design algorithm for a nonvolatile memory cell with narrower cycling margin and charge loss margin. The narrower threshold voltage distributions 511 and 552 correspond to the low threshold voltage state and high threshold voltage state, respectively, of the margin detection cells. The data cell high threshold voltage state is programmed to a threshold voltage level B3 155. The margin detection cell high threshold voltage level is B3' 550. There is a narrower margin between the margin detection cell high threshold voltage level B3' 550 and the high bound of the final threshold voltage window B2' 551. There is a wider margin between the data cell high threshold voltage level B3 155 and the upper end of the final threshold voltage window B2 165. Thus, a failure to retain charge in the corresponding reference cell is detected sooner than in the data cell. The narrower margin corresponding to the margin detection cell therefore controls the refresh time of the data memory cell. The table below shows the threshold voltages corresponding to different points along the voltage axis. According to this algorithm, a data cell doesn't need to keep a large charge loss margin for a long time. With the algorithm, the data cell can keep a smaller cycling margin and improve the nonvolatile memory cell operating window. The threshold voltage state 511 can also be tuned to monitor the C.M. & R.T.+R.D. window, to narrow this window and improve the operating window.

|  | Margin Mode 15 μA | Target Device 1 μA Vth |
| --- | --- | --- |
| 111 | 3.05 V | 1.90 V |
| 115 | 3.45 V | 2.3 V |
| 125 | 3.85 V | 2.7 V |
| 135 | 4.0 V | 2.85 V |
| 145 | 4.7 V | 3.55 V |
| 550 | 4.8 V | 3.65 V |
| 155 | 4.9 V | 3.75 V |
| 165 | 5.6 V | 4.45 V |

Figure 6:
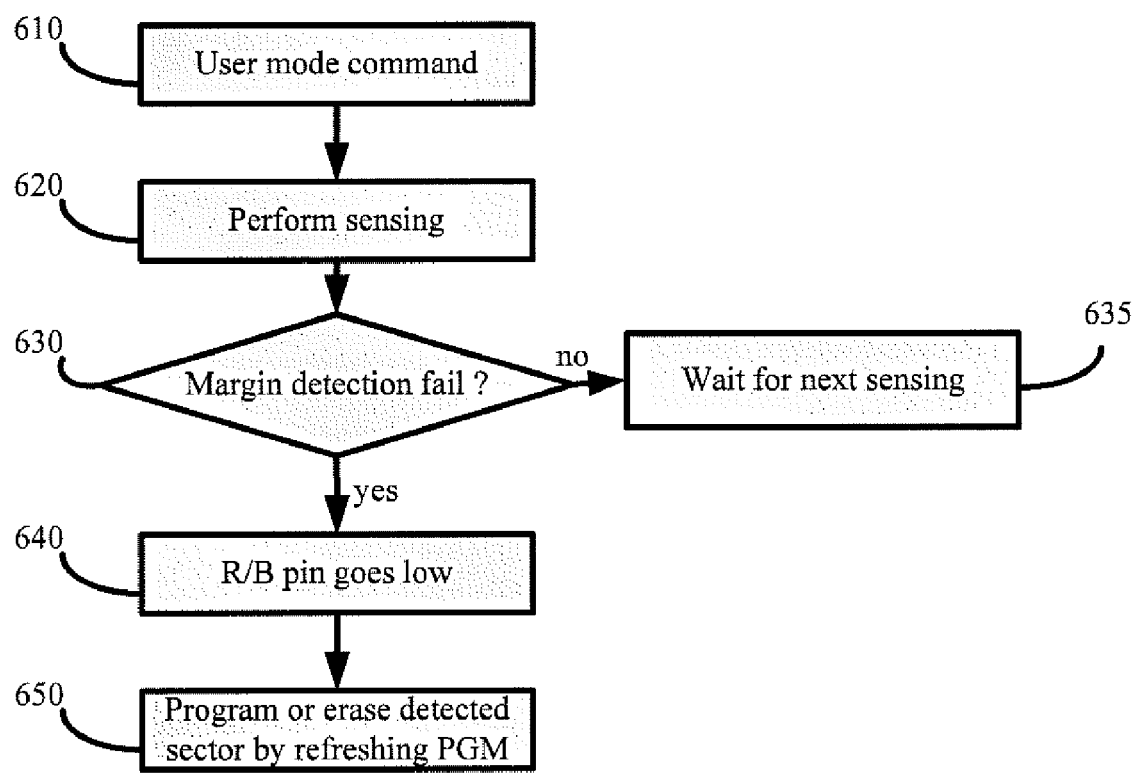
FIG. 6 shows a process flow of controlling the output of the R/B pin to indicate the status of the refresh function.

FIG. 6 shows a process flow of controlling the output of the R/B pin to indicate the status of the refresh function. In 610, a user mode command is received, such as read, program, erase, read ID, etc. In 620, the sensing action is performed. In 630, it is determined from the sense amplifier result whether the refresh cycling margin failed because of the narrow operating margin If there is no failure, then the next sensing operation is awaited. If there is a failure, then in 640 the ready/busy pin goes low. Thus, a state machine controls the ready/busy pin in response to the error determined. Finally in 650 the data cells corresponding to the failure are refreshed.

Figure 7:
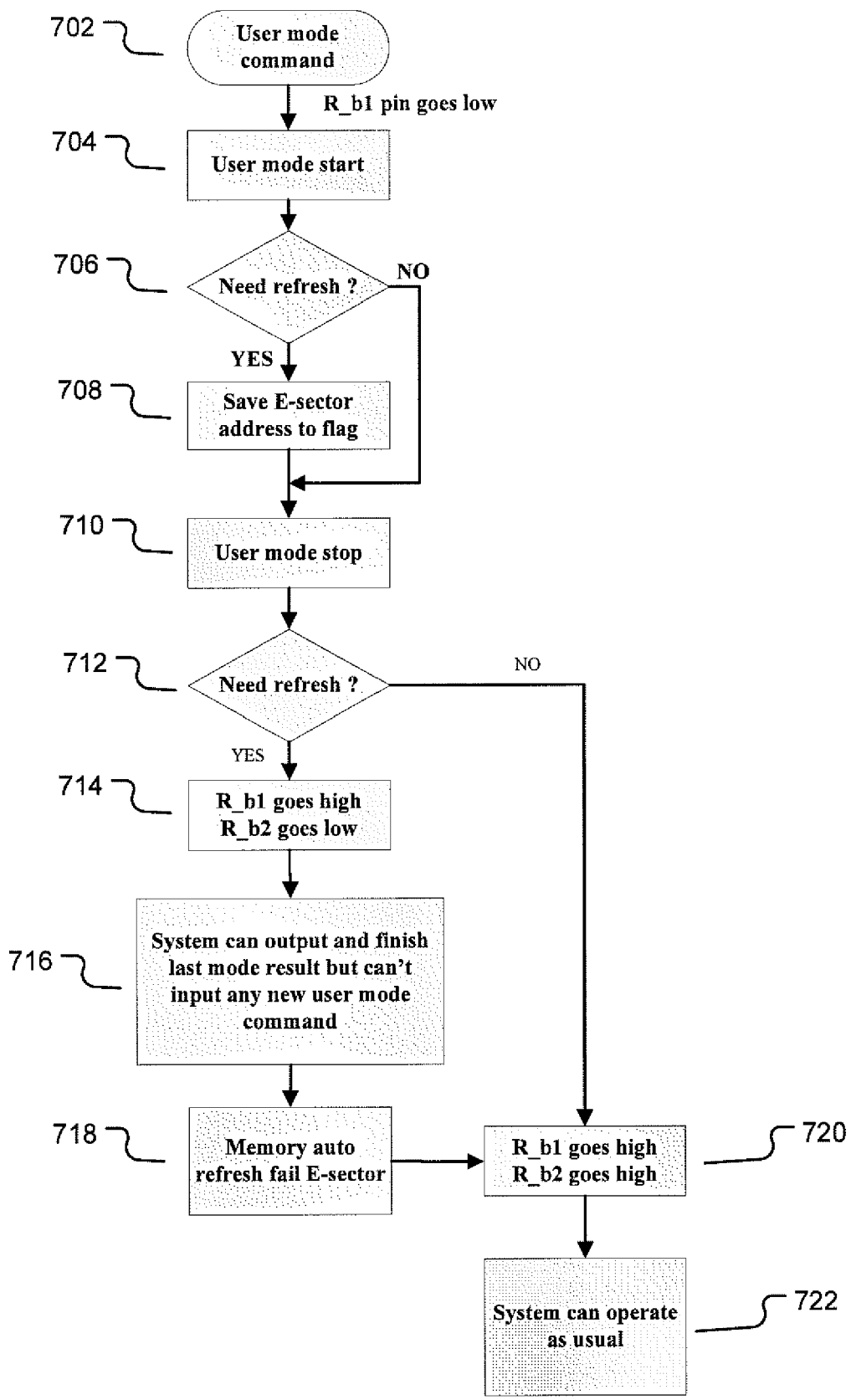
FIG. 7 shows a process flow of controlling the output of multiple R/B pins to indicate the status of the refresh function.

FIG. 7 shows a process flow of controlling the output of multiple R/B pins to indicate the status of the refresh function. This process builds up the refresh function in memory. In 702, a user mode command is received, such as to program a particular data memory cell. Pin R_b1 goes low. In 704, user mode starts. In 706, it is determined whether the data memory cells needs to be refreshed. If yes, then the process continues in 708 and the sector address is saved. If no, user mode stops in 710. Similarly, after 708, the process continues to in 710 and user mode stops. In 712, depending on whether refresh was needed. If refresh was not needed, the process ends in 720, pin R_b1 and R_b2 go high. If refresh was needed, the process continues to 714. In 714, pin R_b1 goes high, and pin R_b2 goes low. In 716, the system outputs and finishes the last mode result, but can't input any new user command, without first refreshing. In 718, the memory is refreshed, as located by the sector address saved in 708. The process ends in 720, and both pin R_b1 and pin R_b2 go high. The following truth table shows the memory status directed by the two pins R_b1 and R-b2.

|  | R_b1 | R_b2 |
| --- | --- | --- |
| Ready | 1 | 1 |
| Busy | 0 | X |
| Refresh | 1 | 0 |

Figure 8:
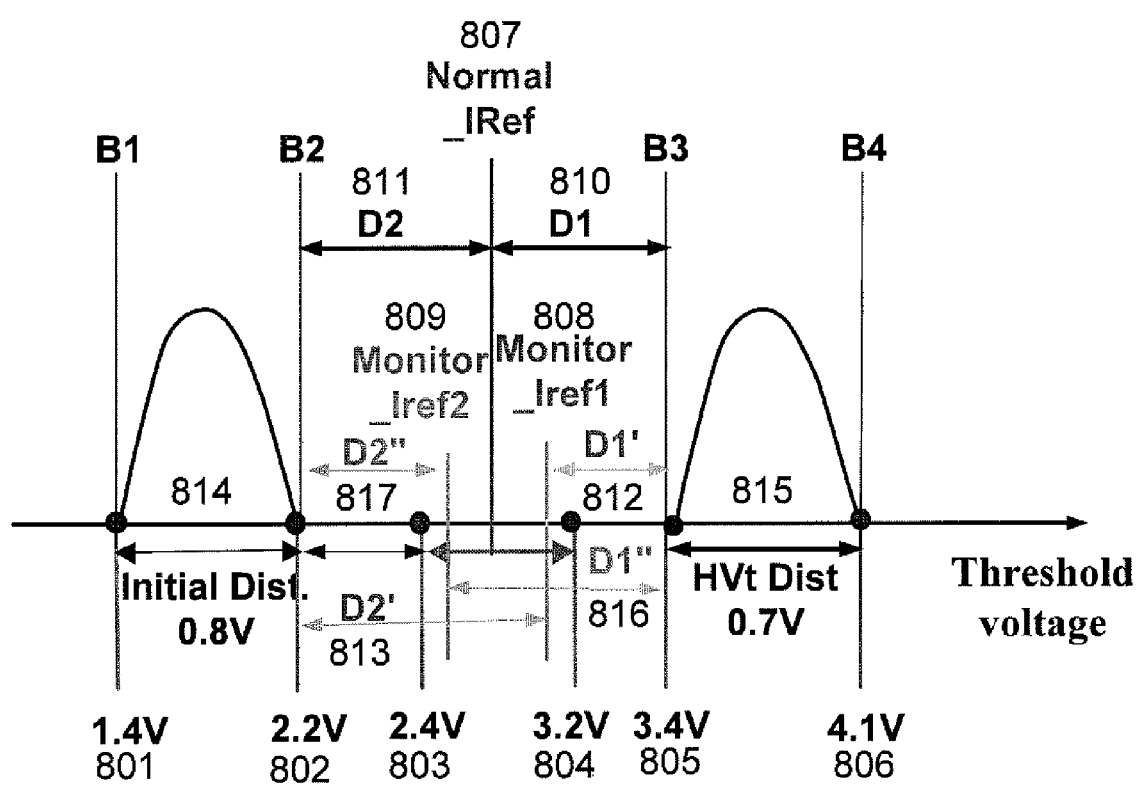
FIG. 8 shows a threshold voltage distribution for nonvolatile memory cells with narrower charge loss margin and narrower CM+RT+RD margin by using the normal_Iref, monitor_Iref1 and monitor_Iref2 without extra margin detection memory.

FIG. 8 shows a threshold voltage distribution of memory cells. 801 is the low bound of the low threshold voltage distribution B1. 802 is the high bound of the low threshold voltage distribution B2. 805 is the low bound of the high threshold voltage distribution B3. 806 is the high bound of the high threshold voltage distribution B4. A normal sense amplifier will sense the memory data by using a normal_Iref 807 and have a margin D1 810 for charge loss of high threshold voltage cells and margin D2 811 for charge gain of low threshold voltage cells. Without the refreshing, the memory needs to leave a large window so memory cells can have charge loss or charge gain, for example after 10K cycles and 10 years. This design suffers very seriously from a wide circuit sensing window, especially for multi-levels in one cell. So memory sensing with added monitor_Iref1 808 and monitor_Iref2 809 can narrow the threshold voltage margin of the memory cell. For example, monitor_Iref1 808 has a narrower sensing margin D1' 812 compared to D1 810 and a wider sensing margin D2' 813 compared to D2 811, so monitor_Iref1 has a smaller sensing window for high threshold voltage cells and a larger sensing window for low threshold voltage cells. Because a high threshold voltage cell fails more easily than a low threshold voltage cell with monitor_Iref1, monitor_Iref1 is used to detect the high threshold voltage margin. After the high threshold voltage of memory cells have some charge loss, the sensing with monitor_Iref1 fails, but the sensing with normal_Iref still passes. If the logic data sensed by normal_Iref is a high threshold voltage, the logic data from sensing with normal_Iref is compared with the first logic data from sensing with monitor_Iref1. If this comparison results in a mismatch, then the memory knows that this memory block of this memory cell needs to perform refreshing. Similarly, monitor_Iref2 809 has a wider sensing margin D1" 816 compared to D1 810 and a narrower sensing margin D2" 817 compared to D2, so monitor_Iref2 has a smaller sensing window for low threshold voltage cells and a larger sensing window for high threshold voltage cells. Because a low threshold voltage cell fails more easily than a high threshold voltage cell with monitor_Iref2 monitor_Iref2 is used to detect the low threshold voltage margin. After the low threshold voltage of memory cells have charge gain, the sensing with monitor_Iref2 fails, but the sensing with normal_Iref still passes. If the logic data sensed by normal_Iref is a low threshold voltage, the logic data from sensing with normal_Iref is compared with the second logic data from sensing with monitor_Iref2. If this comparison results in a mismatch, then the memory knows that this memory block of this memory cell needs to perform refreshing. Monitor_Iref1 and monitor_Iref2 can be used separately or at the same time. For example: if the data='1' then compare with the first logic data, if the data='0' then compare with the second logic data. The description described charge loss from high threshold voltage cells and charge gain in low threshold voltage cells. Another embodiment has charge loss from low threshold voltage cells and charge gain to high threshold voltage cells.

Figure 9A:
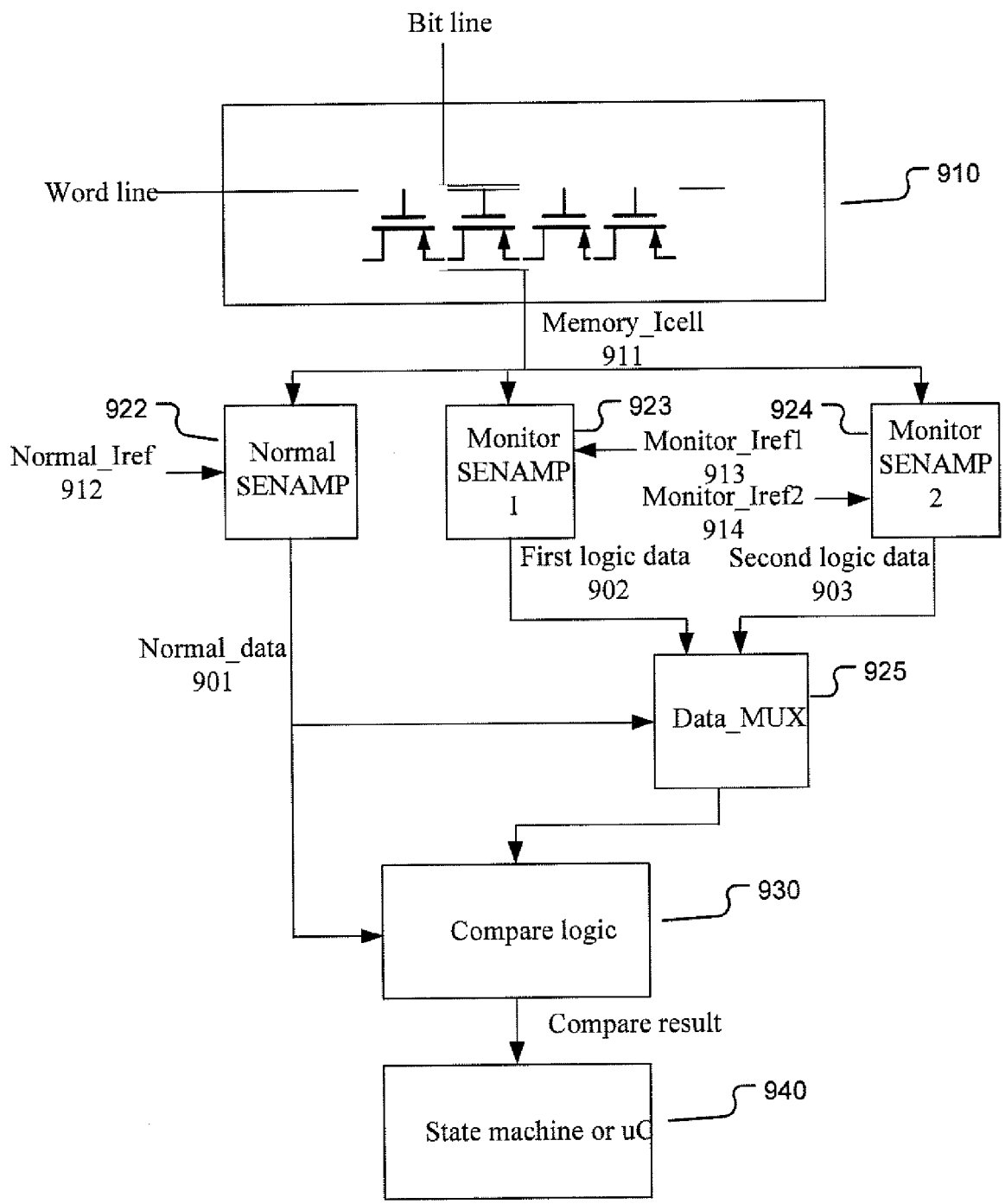
FIG. 9A shows a process flow of performing parallel sensing to determine whether to perform the refresh function with both normal sense amplifier and monitor sense amplifier with first and second monitor reference currents, that implements FIG. 8.

FIG. 9A shows a process flow of performing parallel sensing to determine whether to perform the refresh function. Data cells 910 are accessed via word lines and bit lines.

Figure 9B:
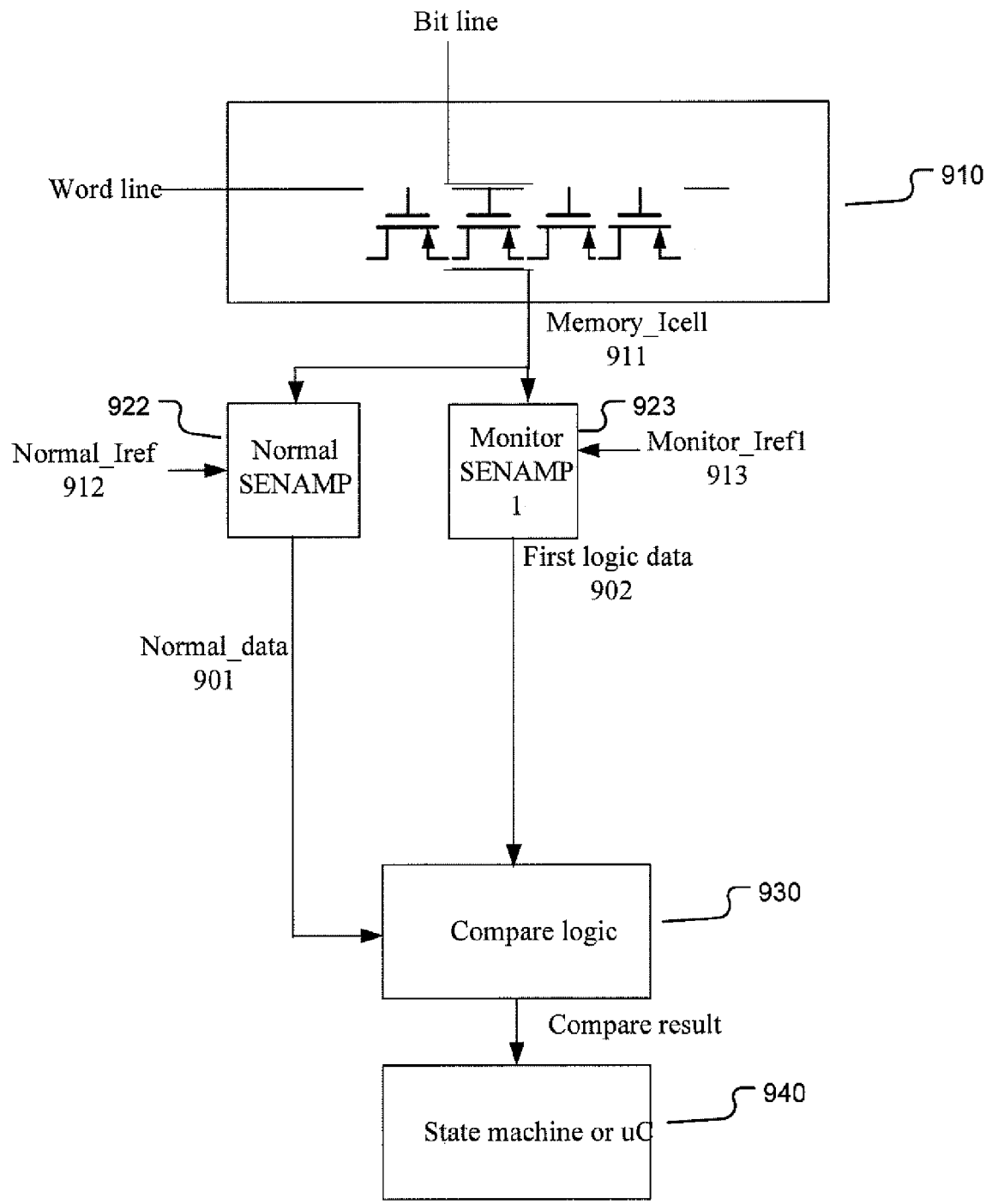
FIG. 9B shows a process flow of performing parallel sensing similar to FIG. 9A, but uses the first monitor reference current without using the second monitor reference current.
Figure 9C:
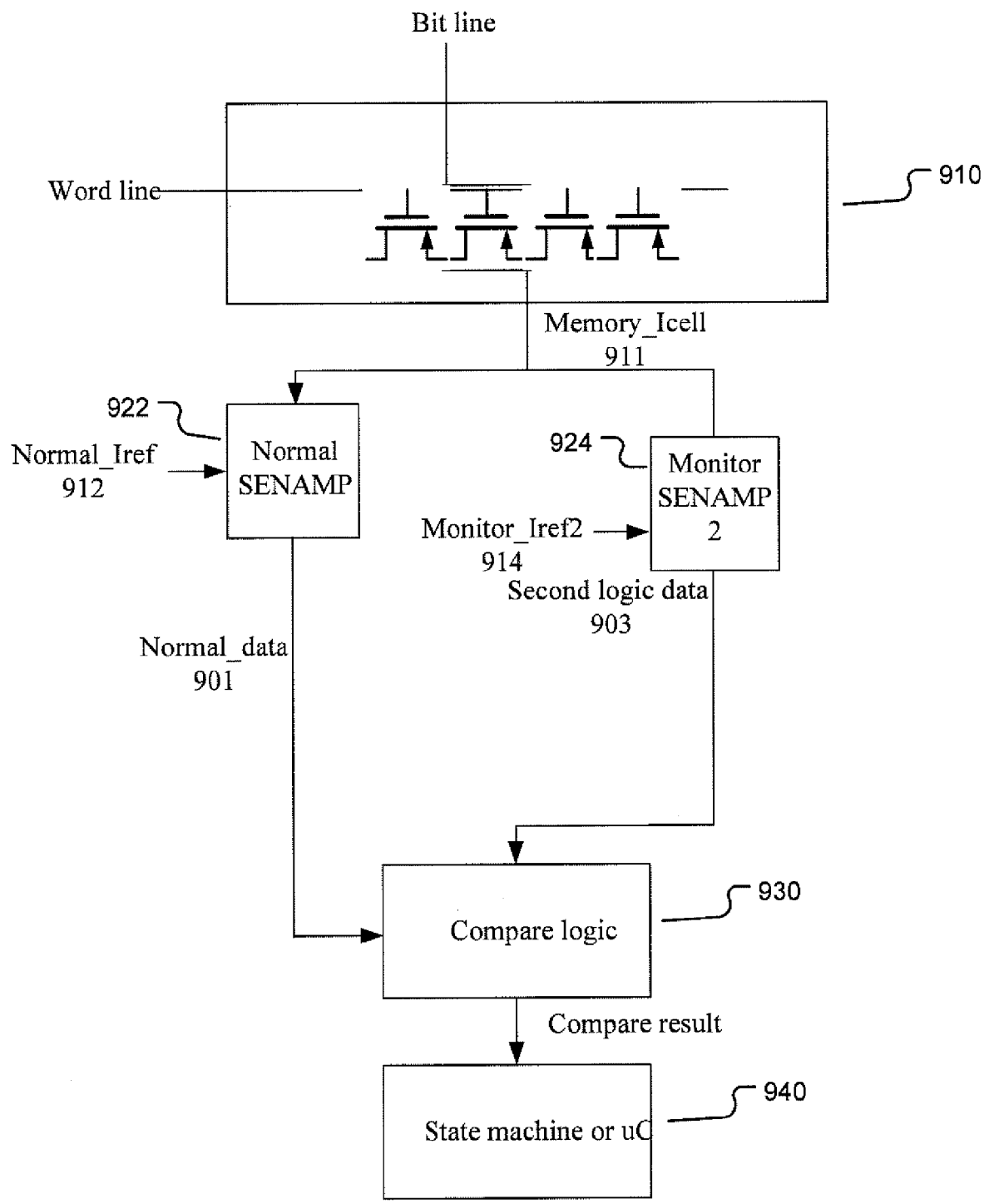
FIG. 9C shows a process flow of performing parallel sensing similar to FIG. 9A, but uses the second monitor reference current without using the first monitor reference current.

A selected data cell from data cells 910 provides a measurement current memory_Icell 911 via a bit line. This measurement current memory_Icell 911 is sensed by the normal sense amplifier 922 using the nornal_Iref 912 to get the normal_data 901; sensed by the monitor sense amplifier 923 using the monitor_Iref1 913 to get the first logic data 902; sensed by the monitor sense amplifier 924 using the monitor_Iref2 914 to get the second logic data 903. The first logic data 902 and the second logic data 903 are input to a data_MUX 925 and selected by normal_data 901. If the normal_data 901 is a high threshold voltage, then data_MUX 925 outputs first logic data 902 as input to compare logic 930. If the normal_data 901 is a low threshold voltage, then data_MUX 925 outputs second logic data 903 as input to compare logic 930. Compare logic block 930 also receives normal_data 901 as input. The normal sense amplifier 922 compares the memory_Icell 911 with the reference current normal_Iref 912, and generates the output normal_data 901. The monitor sense amplifier 1 923 compares the memory_Icell 911 with the monitor_Iref1 913, and generates the output first logic data 902. The monitor sense amplifier 2 924 compares the memory_Icell 911 with the monitor_Iref1 914, and generates the output second logic data 903. Based on the comparison by compare logic 930 of the normal_data 901 and the output of the data MUX 925, compare logic 930 outputs a match or a mismatch to the state machine or microcontroller 940, and the state machine or microcontroller 940 determines whether to refresh the selected data memory cell from data memory cells 910. FIG. 9B and FIG. 9C respectively show using monitor_Iref1 but not monitor_Iref2, and using monitor_Iref2 but not monitor_Iref1. If only applying one monitor_Iref, then the data_MUX 925 is unnecessary.

Figure 10A:
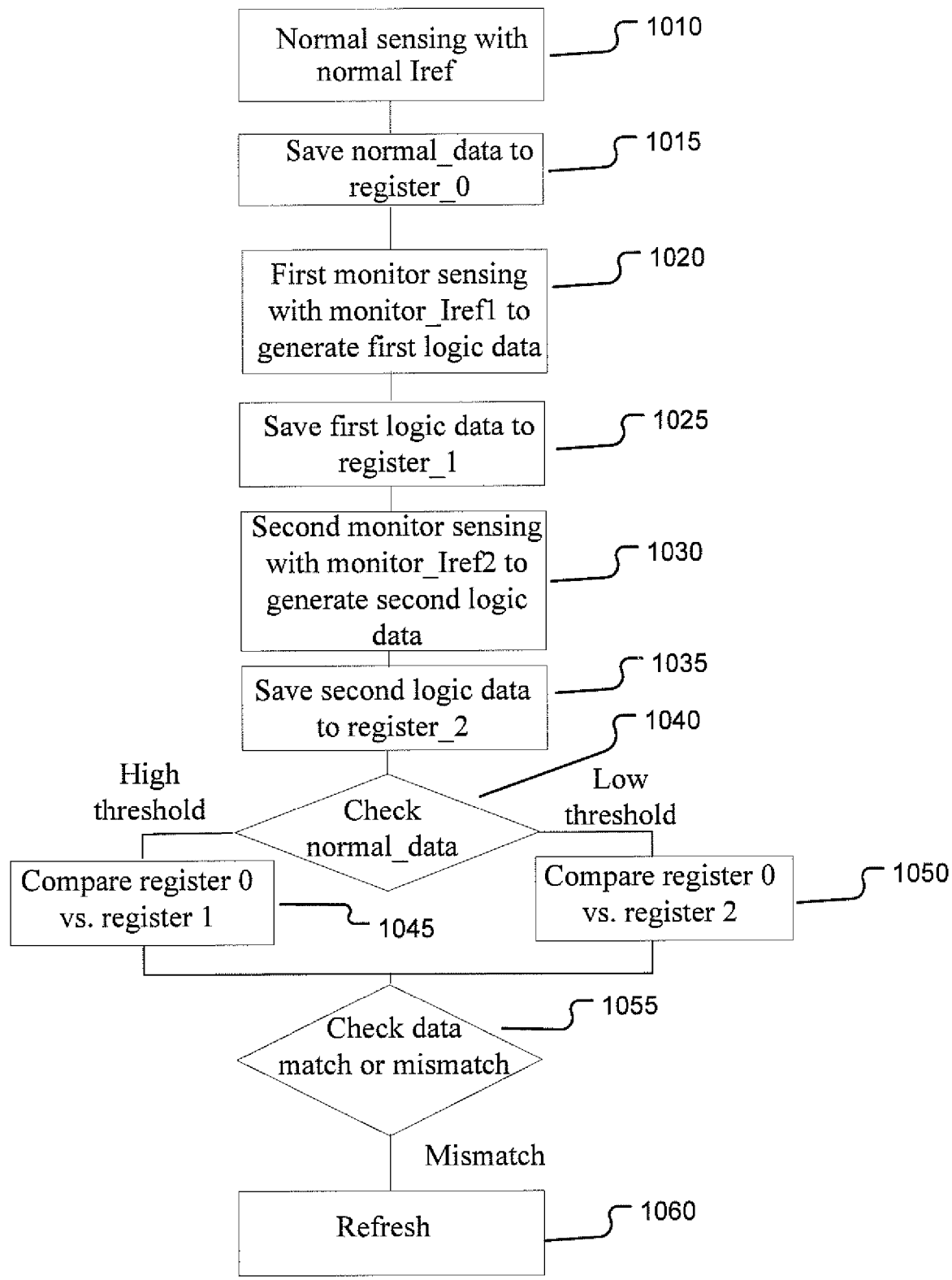
FIG. 10A shows a process flow of performing serial sensing with first and second monitor reference currents to determine whether to perform the refresh function with only a normal sense amplifier, that implements FIG. 8.
Figure 10B:
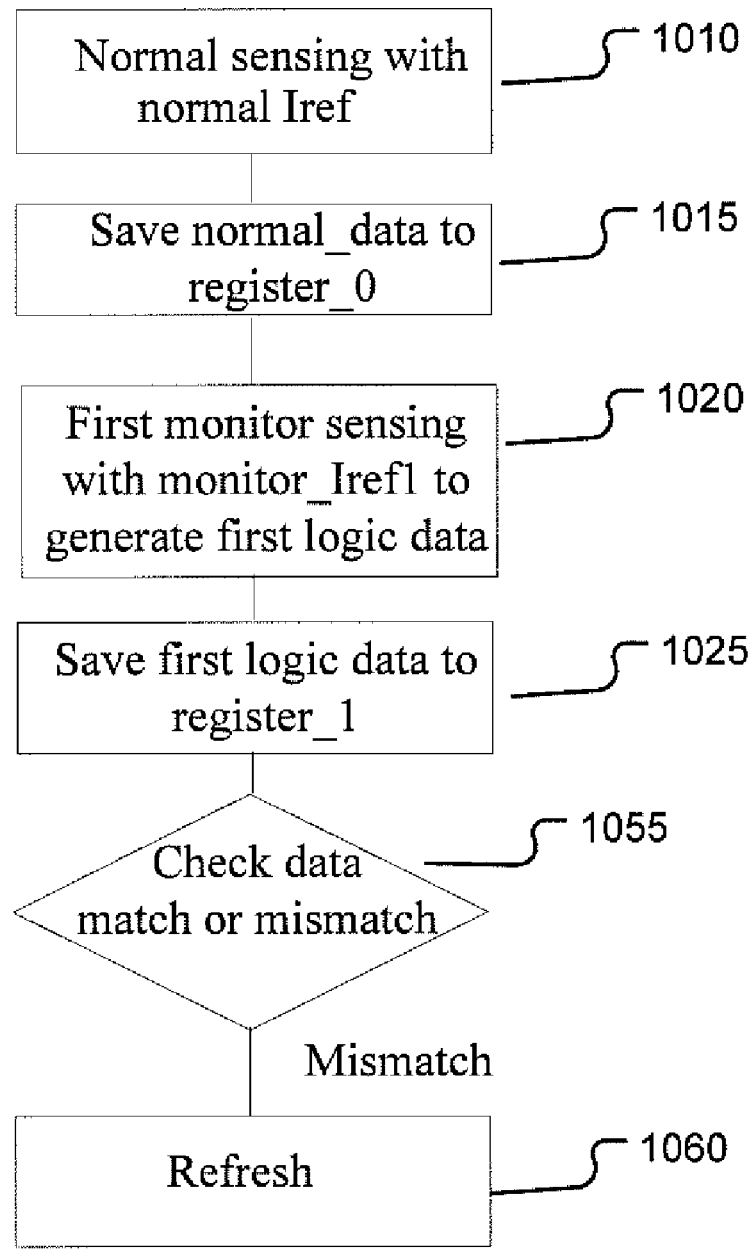
FIG. 10B shows a process flow of performing serial sensing similar to FIG. 10A, but using the first monitor reference current without using the second monitor reference current
Figure 10C:
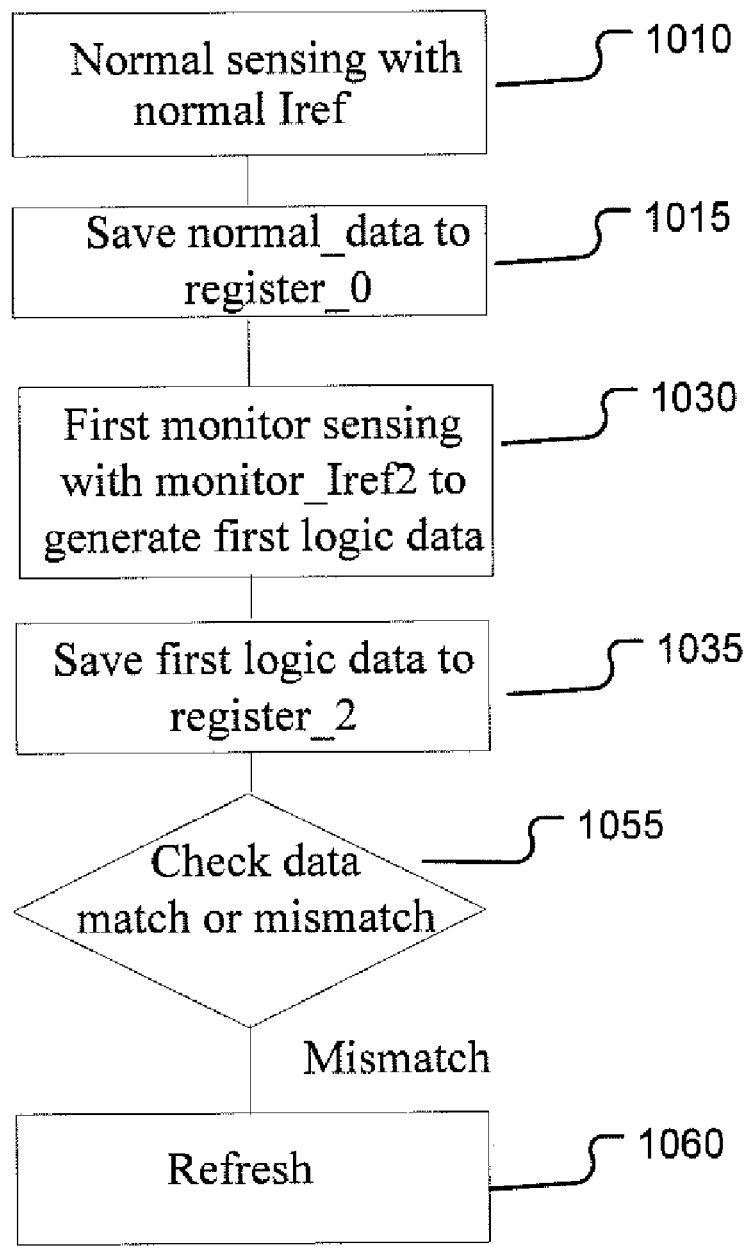
FIG. 10C shows a process flow of performing serial sensing similar to FIG. 10A, but using the second monitor reference current without using the second monitor reference current

FIG. 10A shows a process flow of performing serial sensing to determine whether to perform the refresh function. In serial sensing, the memory doesn't need the extra monitor sense amplifiers 923 and 924. Instead, the normal sense amplifier senses over multiple cycles with the different reference currents, normal_Iref, monitor_Iref1 and monitor I_ref2. This process flow is performed, for example, in a nonvolatile memory with the design of FIG. 8, but without the monitor sense amplifiers. In 1010, normal sensing is performed with the reference current normal_Iref based on nominal data memory operation to generate the sensed output normal_data. In 1015, save the normal_data to register_0. In 1020, first monitor sensing is performed with the monitor current monitor_Iref1 to generate the sensed output first logic data. In 1025, save the first logic data to register_1. In 1030, second monitor sensing is performed with the monitor current monitor_Iref2 to generate the sensed output second logic data. In 1035, save the second logic data to register_2. In 1040, check the normal_data if the normal_data is high threshold then compare register 0 VS register1 045; if the normal_data is low threshold then compare register 0 VS register 2 1050. In 1055, check the data is match or mismatch. In 1060, if the data is mismatch then refreshing. FIG. 10B and FIG. 10C respectively show the use of monitor_Iref1 without monitor_Iref2, and the use of monitor_Iref2 without monitor_Iref1. If only applying one monitor_Iref, then step 1040 is not used.

Figure 11:
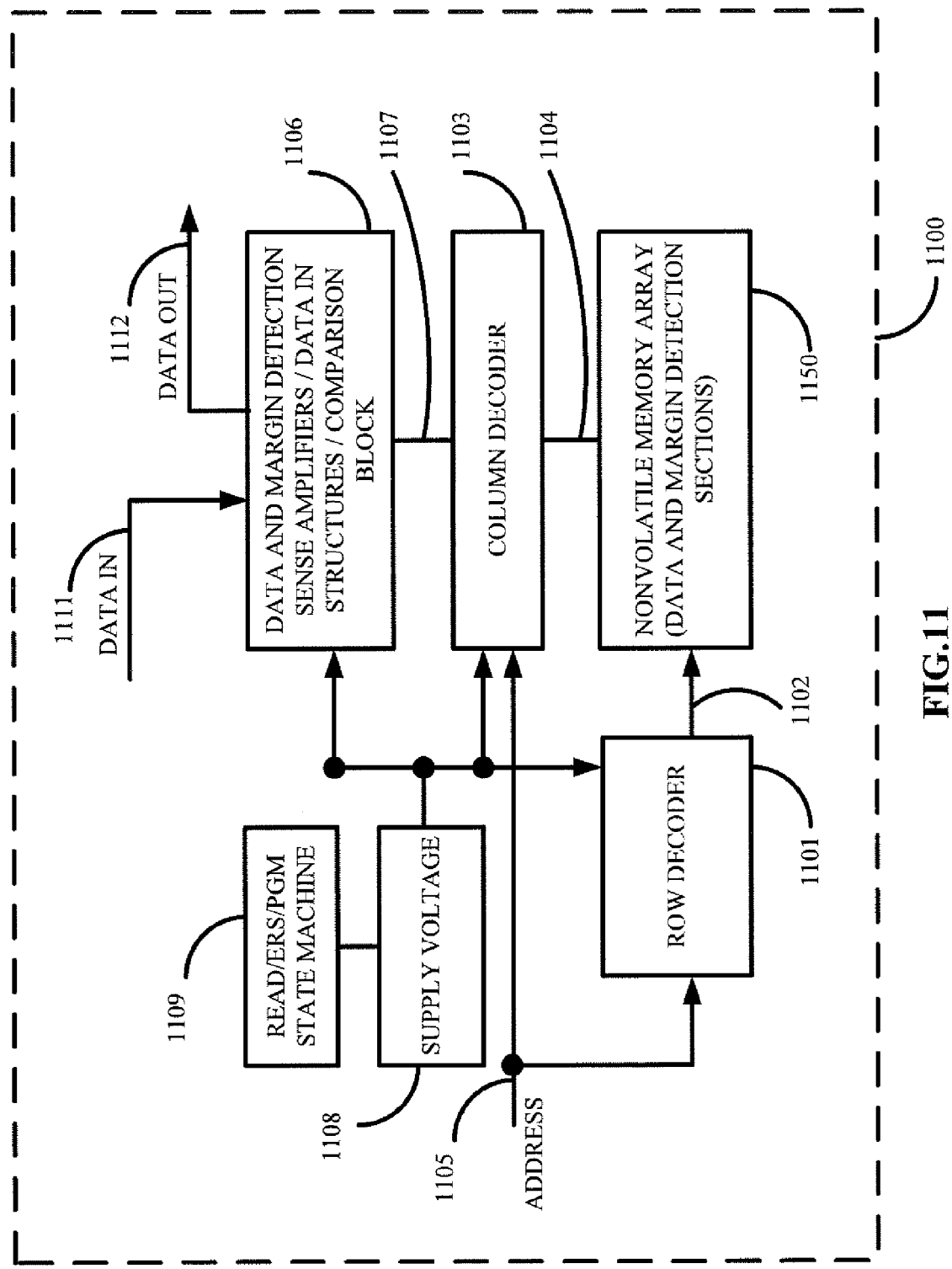
FIG. 11 shows a block diagram for performing parallel sensing to determine whether to perform the refresh function, with margin detection cells and a margin detection sense amplifier.

FIG. 11 is a simplified diagram of an integrated circuit with nonvolatile memory cells and the refresh circuitry. The integrated circuit 1100 includes a memory array 1150 implemented using data and margin detection sections of nonvolatile memory cells, on a semiconductor substrate. The memory cells of array 1150 may be individual cells, interconnected in arrays, or interconnected in multiple arrays. A row decoder 1101 is coupled to a plurality of word lines 1102 arranged along rows in the memory array 1150. A column decoder 1103 is coupled to a plurality of bit lines 1104 arranged along columns in the memory array 1150. Addresses are supplied on bus 1105 to column decoder 1103 and row decoder 1101. Data sense amplifier, margin detection sense amplifiers, data-in structures, and comparison block in block 1106 are coupled to the column decoder 1103 via data bus 1107. Data is supplied via the data-in line 1111 from input/output ports on the integrated circuit 1100, or from other data sources internal or external to the integrated circuit 1100, to the data-in structures in block 1106. Data is supplied via the data-out line 1115 from the sense amplifiers in block 1106 to input/output ports on the integrated circuit 1100, or to other data destinations internal or external to the integrated circuit 1100. A bias arrangement state machine 1109 controls the application of bias arrangement supply voltages 1108, such as for the erase verify and program verify voltages, and the arrangements for programming, erasing, and reading the memory cells.

Figure 12:
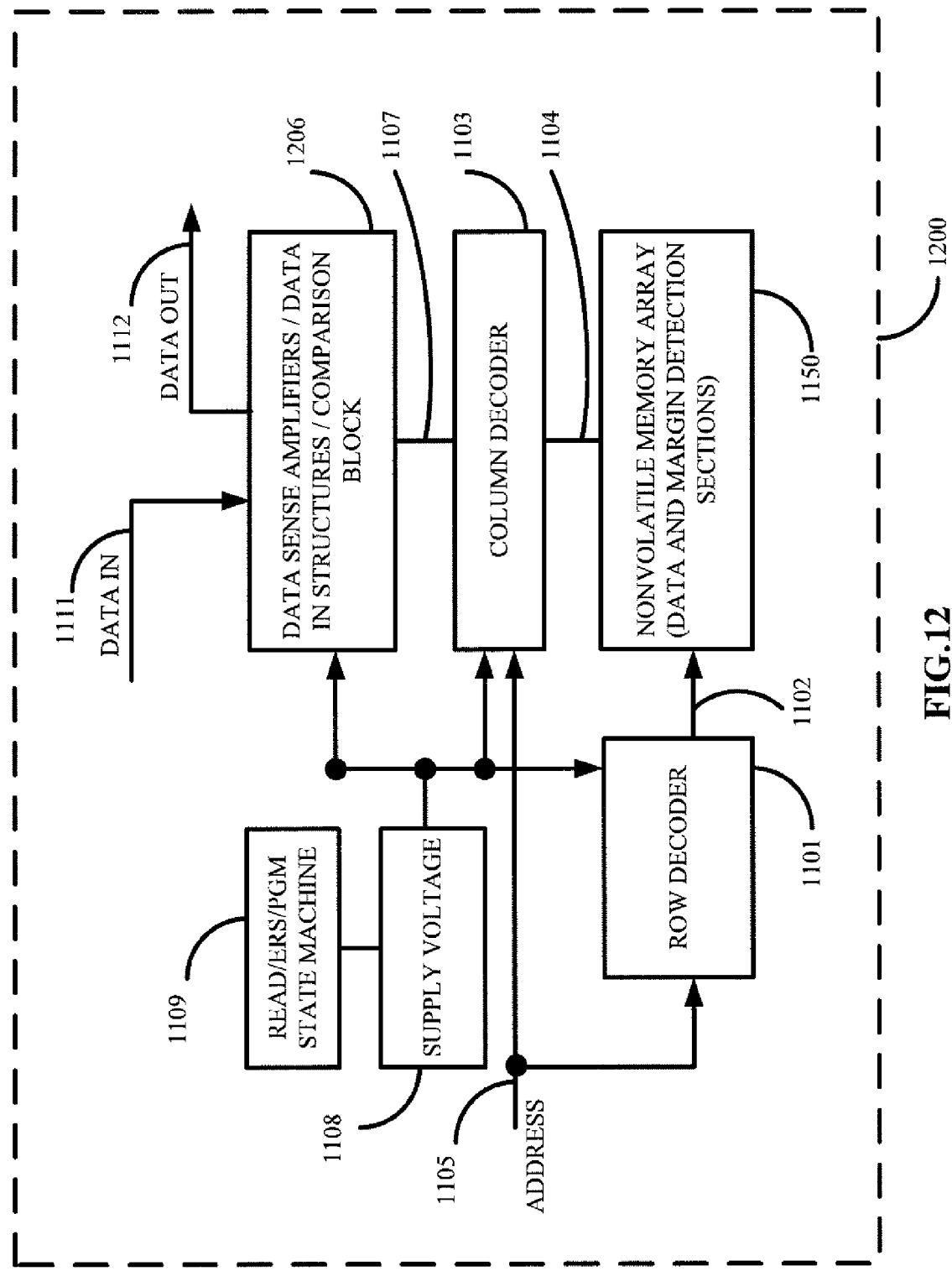
FIG. 12 shows a block diagram for performing serial sensing to determine whether to perform the refresh function, with margin detection cells.

FIG. 12 is a simplified diagram of an integrated circuit with nonvolatile memory cells and the refresh circuitry. The integrated circuit 1200 includes a memory array 1 150 implemented using data and margin detection sections of nonvolatile memory cells, on a semiconductor substrate. The memory cells of array 1150 may be individual cells, interconnected in arrays, or interconnected in multiple arrays. Data sense amplifiers, comparison block, and data-in structures in block 1206 are coupled to the column decoder 1103 via data bus 1107. Data is supplied via the data-in line 1111 from input/output ports on the integrated circuit 1200, or from other data sources internal or external to the integrated circuit 1200, to the data-in structures in block 1206. Data is supplied via the data-out line 11 15 from the block 1206 to input/output ports on the integrated circuit 1200, or to other data destinations internal or external to the integrated circuit 1200.

Figure 13:
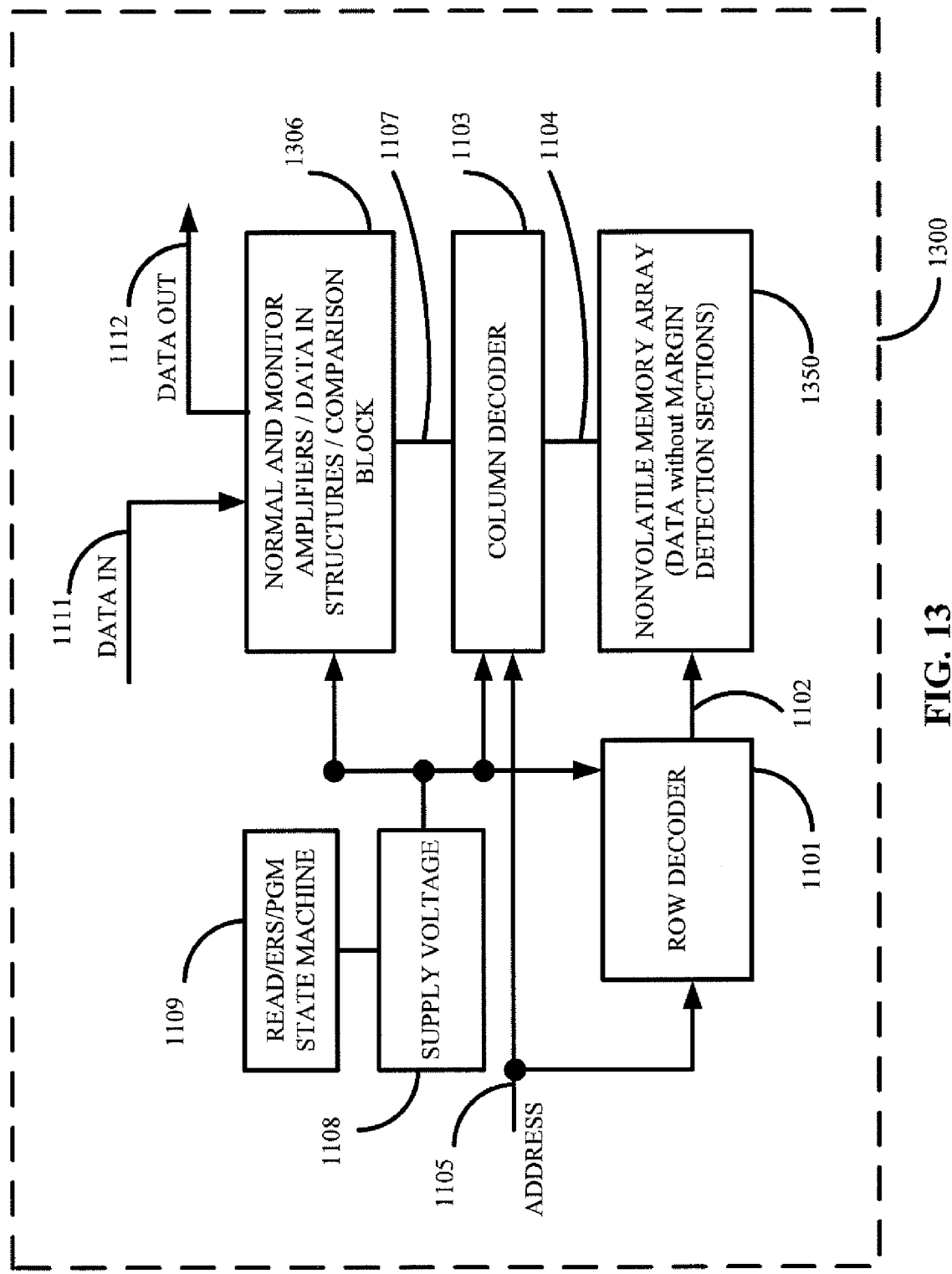
FIG. 13 shows a block diagram for performing parallel sensing to determine whether to perform the refresh function, with both a normal sense amplifier and a monitor sense amplifier. The normal sense amplifier senses with normal_Iref and the monitor sense amplifier senses with monitor_Iref.

FIG. 13 is a simplified diagram of an integrated circuit with nonvolatile memory cells and the refresh circuitry. The integrated circuit 1300 includes a memory array 1350 implemented using data memory cells on a semiconductor substrate. The memory cells of array 1350 may be individual cells, interconnected in arrays, or interconnected in multiple arrays. A row decoder 1101 is coupled to a plurality of word lines 1102 arranged along rows in the memory array 1350. A column decoder 1103 is coupled to a plurality of bit lines 1104 arranged along columns in the memory array 1350. Addresses are supplied on bus 1105 to column decoder 1103 and row decoder 1101. Normal sense amplifiers, monitor sense amplifiers, comparison block, and data-in structures in block 1306 are coupled to the column decoder 1103 via data bus 1107. Data is supplied via the data-in line 1111 from input/output ports on the integrated circuit 1300, or from other data sources internal or external to the integrated circuit 1300, to the data-in structures in block 1306. Data is supplied via the data-out line 1115 from the sense amplifiers in block 1306 to input/output ports on the integrated circuit 1300, or to other data destinations internal or external to the integrated circuit 1300.

Figure 14:
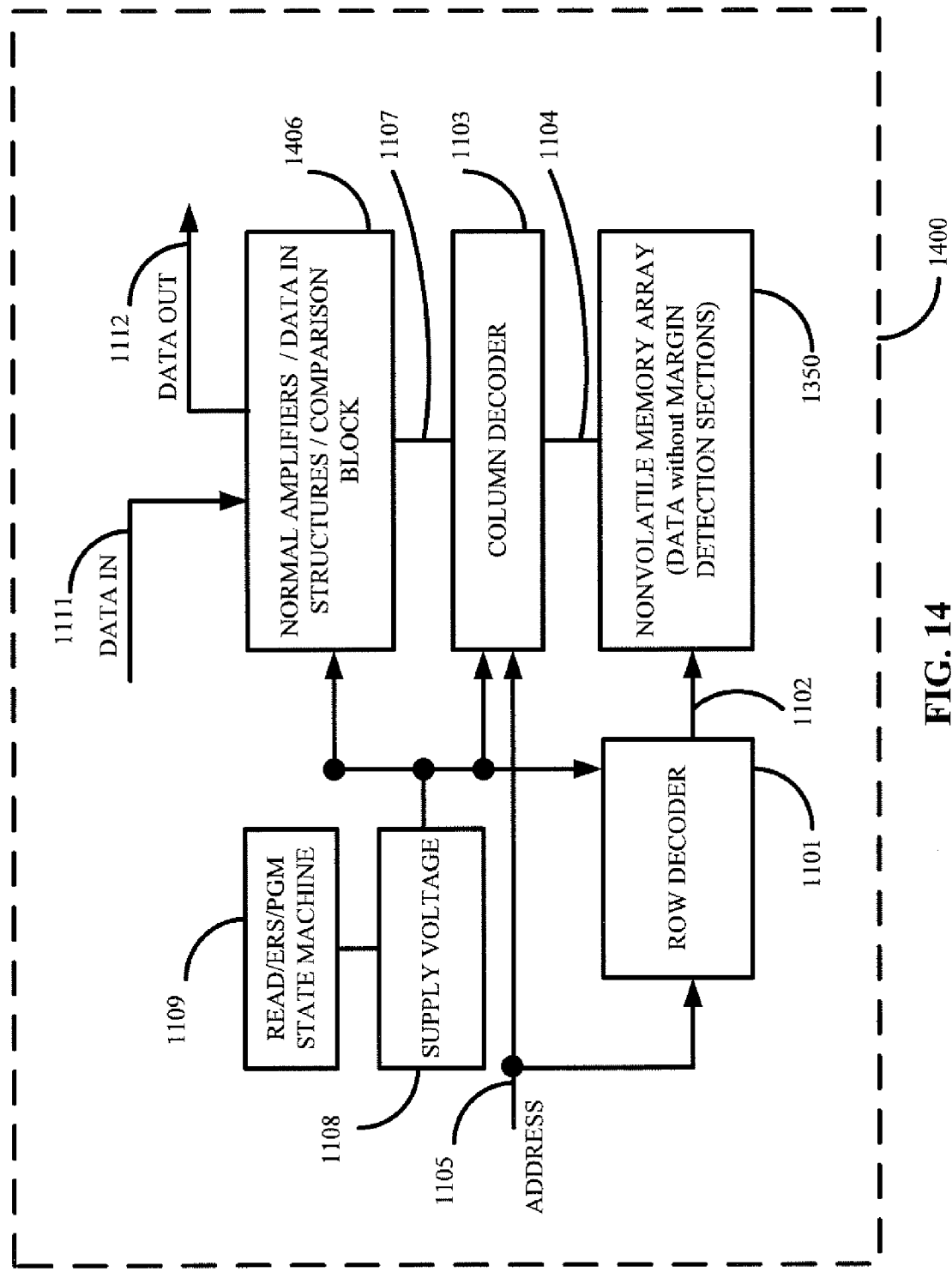
FIG. 14 shows a block diagram for performing serial sensing to determine whether to perform the refresh function, with a sense amplifier that senses with normal_Iref and monitor_Iref in different cycles.

FIG. 14 is a simplified diagram of an integrated circuit with nonvolatile memory cells and the refresh circuitry. The integrated circuit 1400 includes a memory array 1350 implemented using data memory cells on a semiconductor substrate. Addresses are supplied on bus 1005 to column decoder 1103 and row decoder 1101. Sense amplifiers, comparison block, and data-in structures in block 1406 are coupled to the column decoder 1103 via data bus 1107. Data is supplied via the data-in line 1111 from input/output ports on the integrated circuit 1400, or from other data sources internal or external to the integrated circuit 1400, to the data-in structures in block 1406. Data is supplied via the data-out line 1115 from the block 1406 to input/output ports on the integrated circuit 1400, or to other data destinations internal or external to the integrated circuit 1400.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A nonvolatile memory integrated circuit, comprising:
    nonvolatile memory cells, including:
        a plurality of data cells storing at least data values associated with a low threshold voltage and a high threshold voltage;
    reference current circuitry generating reference currents each with a high sensing window to sense the high threshold voltage and a low sensing window to sense the low threshold voltage, the reference currents including:
        a normal reference current associated with a first operating window having a first high sensing window and a first low sensing window;
        a first monitor reference current associated with a second operating window having a second high sensing window narrower than the first high sensing window, and a second low sensing window wider than the first low sensing window; and
        a second monitor reference current associated with a third operating window having a third high sensing window wider than the first high sensing window and a third low sensing window narrower than the first low sensing window;
    one or more sets of sense amplifier circuitry sensing a memory current from the plurality of data cells with the normal reference current to generate a first result and with at least one of: the first monitor reference current to generate a second result, and the second monitor reference current to generate a third result; and
    comparison logic comparing the first result with at least one of the second result and the third result from the sense amplifier circuitry.

2. The circuit of claim 1, wherein said one or more sets of sense amplifiers includes a single set of sense amplifiers sensing the memory current from the plurality of data cells, in series, with the normal reference current and at least one of the first and second monitor reference currents.

3. The circuit of claim 1, wherein said one or more sets of sense amplifiers includes:
    a first set of sense amplifiers sensing the memory current from the plurality of data cells with the normal reference current; and
    a second set of sense amplifiers sensing the memory current from the plurality of data cells with at least one of the first and second monitor reference currents.

4. The circuit of claim 1, wherein said one or more sets of sense amplifiers includes:
    a first set of sense amplifiers sensing the memory current from the plurality of data cells with the normal reference current;
    a second set of sense amplifiers sensing the memory current from the plurality of data cells with the first monitor reference current; and
    a third set of sense amplifiers sensing the memory current from the plurality of data cells with the second monitor reference current.

5. The circuit of claim 1, wherein a failure for results to match, returned by the comparison logic, is at least the memory current falling outside the second operating margin.

6. The circuit of claim 1, wherein a failure for results to match, returned by the comparison logic, is caused by at least charge loss from at least one nonvolatile memory cell.

7. The circuit of claim 1, further comprising:
    an externally accessible contact of the integrated circuit having:
        an output state indicating that the integrated circuit is busy.

8. The circuit of claim 1, further comprising:
    a first externally accessible contact of the integrated circuit indicating at least whether the integrated circuit is busy determining a need to refresh; and
    a second externally accessible contact of the integrated circuit indicating at least whether the integrated circuit is ready for a new command or refreshing.

9. The circuit of claim 1, wherein the plurality of data cells has a charge loss margin of less than 0.7 V.

10. The circuit of claim 1, wherein the plurality of data cells has a charge loss margin of about 0.2 V.

11. The circuit of claim 1, wherein the plurality of data cells has a cycling margin of less than 0.4 V.

12. The circuit of claim 1, wherein the plurality of data cells are multi-level cells.

13. The circuit of claim 1, wherein at least one of the first and second monitor reference currents is higher than the normal reference current and a low bound representing high threshold voltage cells.

14. The circuit of claim 1, wherein at least one of the first and second monitor reference currents is lower than the normal reference current and a high bound representing low threshold voltage cells.

15. The circuit of claim 1, wherein the first result controls which of the second result and the third result to compare with the first result, to determine whether to refresh said at least one data cell.

16. The circuit of claim 1, wherein:
    if the first result with the normal reference current is the high threshold voltage, then the first result is compared with the second result, and
    if the first result with the normal reference current is the low threshold voltage, then the first result is compared with the third result.

17. The circuit of claim 16, wherein the normal reference current controls a data mux to select the second result or the third result.

18. The circuit of claim 1, further comprising:
    control circuitry responding to a memory user mode command by applying bias arrangements to the plurality of data cells,
        wherein receipt by the control circuitry of memory user mode commands causes the control circuitry to apply bias arrangements to at least one data cell of the plurality of data cells to generate the memory current,
        wherein the control circuitry refreshes said at least one data cell in response to a failure of the first result to agree with said at least one of the second result and the third result.

19. The circuit of claim 1, wherein only one of the first monitor reference current and the second monitor reference current is used in at least one memory operation.

20. A method of operating nonvolatile memory, comprising:
responsive to a memory user mode command, performing:
applying a bias arrangement to at least one nonvolatile data cell to generate at least one memory current representing data values stored in said at least one nonvolatile data cell, the data values associated with a low threshold voltage and a high threshold voltage;
generating reference currents each with a high sensing window to sense the high threshold voltage and a low sensing window to sense the low threshold voltage, including:
generating a normal reference current associated with a first operating window having a first high sensing window and a first low sensing window;
generating a first monitor reference current associated with a second operating window having a second high sensing window narrower than the first high sensing window, and a second low sensing window wider than the first low sensing window; and
generating a second monitor reference current associated with a third operating window having a third high sensing window wider than the first high sensing window and a third low sensing window narrower than the first low sensing window;
sensing said at least one memory current with the normal reference current to generate a first result, and further performing at least one of:
sensing said at least one memory current with the first monitor reference current to generate a second result; and
sensing said at least one memory current with the second monitor reference current to generate a third result; and
comparing the first result with at least one of the second result and the third result.

21. The method of claim 20, wherein said sensing with the normal reference current occurs in parallel with at least one of: said sensing with the first monitor reference current and said sensing with the second monitor reference current.

22. The method of claim 20, wherein said sensing with the normal reference current occurs in series with at least one of: said sensing with the first monitor reference current and said sensing with the second monitor reference current.

23. The method of claim 20, wherein only one of said sensing with the first monitor reference current and said sensing with the second monitor reference current is performed, in at least one memory operation.

24. The method of claim 20, wherein the first result controls which of said sensing with the first monitor reference current and said sensing with the second monitor reference current is performed, to determine whether to refresh said at least one data cell.

25. The method of claim 20, wherein:
said sensing with the first monitor reference current is performed, if the first result with the normal reference current is the high threshold voltage, and
said sensing with the second monitor reference current is performed, if the first result with the normal reference current is the low threshold voltage.

26. The method of claim 20, further comprising:
refreshing said at least one data cell in response to a failure of the first result to agree with at least one of the second result and the third result.

* * * * *